United States Patent [19]
Rumreich

[11] Patent Number: 5,539,357
[45] Date of Patent: Jul. 23, 1996

[54] PHASE LOCKED LOOP

[75] Inventor: Mark F. Rumreich, Indianapolis, Ind.

[73] Assignee: Thomson Consumer Electronics, Inc., Indianapolis, Ind.

[21] Appl. No.: 528,758

[22] Filed: Sep. 15, 1995

[51] Int. Cl.⁶ .............................. H03L 7/06; H03L 7/085; H03L 7/095
[52] U.S. Cl. ............................ 331/17; 331/1 A; 331/12; 331/15; 331/20; 331/25; 331/DIG. 2; 327/159; 348/536
[58] Field of Search ................................ 331/1 A, 12, 15, 331/17, 20, 25, DIG. 2; 327/156, 159; 348/536–551; 375/376

[56] References Cited

U.S. PATENT DOCUMENTS 5,053,724  10/1991  Ogino et al. .......................... 331/17 X
5,159,292  10/1992  Canfield et al. ........................ 331/1 A Primary Examiner—David Mis
Attorney, Agent, or Firm—Joseph S. Tripoli; Peter M. Emanuel; Richard G. Coalter

[57] ABSTRACT

PLL apparatus for generating an oscillatory signal phase locked to a component of a further signal comprises a variable oscillator for generating the oscillatory signal and a source of the further signal. A phase detector responsive to the oscillatory signal and to the component of the further signal, provides a phase error signal which is coupled to the variable oscillator via a limiter. Circuit means are provided for controlling the limiting level of the limiter. The dual limiting substantially improves the loop noise tolerance and reduces the loop sensitivity to occasional phase reversals of the component of the further signal. Additional enhancements to loop stability and noise immunity are provided by an unlock detector which detects and totalizes phase rotations in a selected area of a phase plane and by a phase wrap detector which maintains a lock indication during phase angle wrapping.

20 Claims, 9 Drawing Sheets

| OCTANT | BINARY | ANGLE |
|--------|--------|-------|
| 0 | 000 | S/L |
| 1 | 001 | 90− S/L |
| 2 | 010 | 90+ S/L |
| 3 | 011 | 180−S/L |
| 4 | 100 | −(S/L) |
| 5 | 101 | −(90−S/L) |
| 6 | 110 | −(90+S/L) |
| 7 | 111 | −(180−S/L) |

PHASE LOCKED LOOP

FIELD OF THE INVENTION

This invention relates to phase locked loops generally, and particularly to phase locked loops for use in applications in which a periodic component of the loop input signal may be subjected to occasional phase inversions.

BACKGROUND OF THE INVENTION

Phase locked loops (PLUs) are circuits well known in the communication arts for synchronizing a variable local oscillator with the phase and/or frequency of a component of a transmitted signal. Typically such circuitry includes a phase detector which is responsive to the transmitted signal and the output of a local oscillator for generating a phase error signal proportional to a difference between a component of the transmitted signal and the oscillator output. The phase error signal is subjected to smoothing and coupled to control the oscillation rate of the variable oscillator thus forming a self-regulating closed loop system. In order to enhance the operation of the PLL, some systems include a second loop which generates an error signal proportional to the difference between the frequency of the variable oscillator and the frequency of the component of the transmitted signal. The frequency error signal is added to the phase error signal for controlling the rate of the oscillator. Nominally, the variable oscillator will achieve the desired frequency before phase lock is achieved, at which time the frequency error signal is substantially zero and the PLL is controlled by only the phase error signal.

An example of a frequency/phase responsive PLL is described by Canfield et al., in U.S. Pat. No. 5,159,292 entitled ADAPTIVE PHASE LOCKED LOOP. In the Canfield system an unlock detector is used to a switch in the frequency error signal path which actively disconnects the frequency error term when the system approaches phase lock. The active disconnection of the frequency term precludes noise in the frequency error signal from causing jitter in the phase of the signal provided by the variable oscillator. In order to detect the frequency unlock condition of the loop, the Canfield system includes a quadrature phase detector that accumulates samples of in-phase and quadrature components of the input signal and the unlock condition is determined by counting the number of times the accumulated in-phase samples change polarity during an interval (e.g., a field) and comparing this count value to a threshold value. In order to prevent the combined frequency and phase error signal from excessively altering the oscillator frequency when unlocked, the combined error signal is applied to a limiter before being low pass filtered and applied to the oscillator.

SUMMARY OF THE INVENTION

In phase locked loops generally a compromise must be made between acquisition speed, which requires a relatively short loop time constant, and steady state stability, which requires a relatively long loop time constant. In the Canfield et al. system a desirable increase in acquisiton speed is obtained without altering the loop time constant by adding the frequency error term to the phase error term when acquiring lock.

The present invention is directed in one respect to meeting the need for further improvement in loop parameters including acquisiton speed and steady state stability.

It has been found that phase locked loops of the general type described may exhibit substantial phase errors, or lock detection errors, or both for video input signals that contain substantial amounts of noise or that have been anti-copy protected by periodic burst phase inversions. (In one anti-copy coding system burst is inverted for 4 of each 20 lines).

The present invention is directed in a second respect to meeting the need for a phase locked loop having improved stability for phase locking to the periodic component of transmitted signals which may be subjected to noisy input signals or to periodic phase inversions.

Phase locked loop apparatus, for generating an oscillatory signal phase locked to a component of a further signal, and in accordance with the present invention, comprises a variable oscillator for generating the oscillatory signal and a source of the further signal. A phase detector responsive to the oscillatory signal and to the component of the further signal, provides a phase error signal which is coupled to the variable oscillator via a limiter. Circuit means are provided for controlling the limiting level of the limiter.

BRIEF DESCRIPTION OF THE DRAWING

The foregoing and further features of the invention are illustrated in the accompanying drawing, wherein like elements are denoted by like reference designators, and in which.

DETAILED DESCRIPTION

Figure 1:
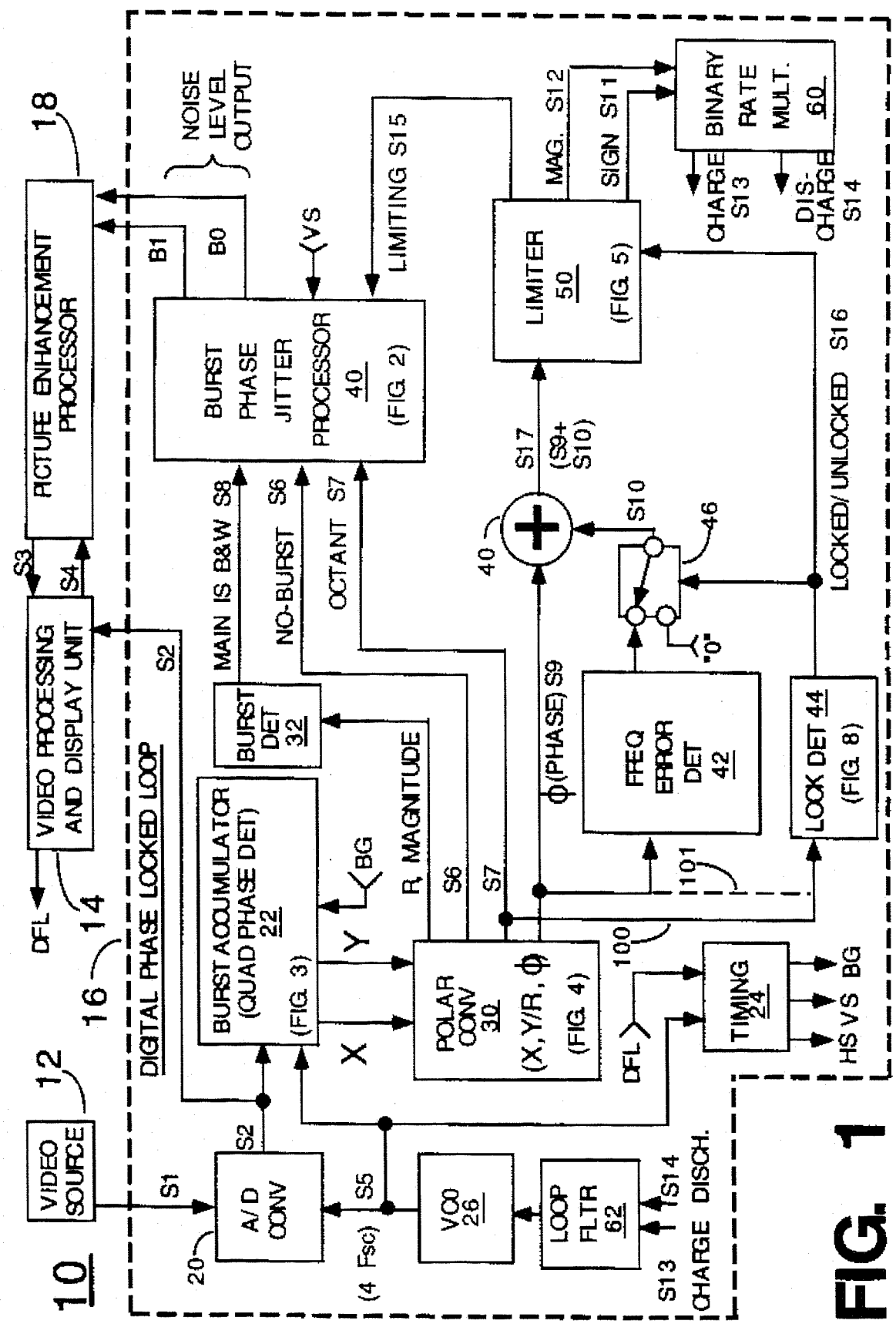
FIG. 1 is a block diagram of a television apparatus including a phase locked loop embodying the invention.

FIG. 1 illustrates a useful application of a phase locked loop embodying the invention in a color television receiver for measuring video signal noise levels so as to control various picture processing parameters of the receiver. Video noise detectors are of general utility in video signal processing apparatus. For example, such detectors may be used to advantage in video systems of a type which are designed to vary functionally in accordance with the level of noise of the video signal being processed. Such noise controlled apparatus include, illustratively, those having noise responsive programmable bandwidth filters, noise responsive horizontal peaking circuits, noise responsive variable saturation chrominance processors and noise reducing recursive filters, to name a few of such uses.

The television apparatus 10 in FIG. 1 includes a video source 12 for providing a video signal S1 and a video signal processing and display unit 14 for displaying the video signal. For television receiver applications the source 12 may include a conventional tuner, IF amplifier and detector. Additionally, source 12 may include one or more baseband video inputs and suitable switching for selecting from plural video input signals. For television monitor applications the tuner may be omitted. The processing and display unit 14 may be of conventional design including, for example, luma and chroma processing circuits, a display (e.g., a kinescope or LCD device) and suitable display driver circuits. To simplify the drawing, details of sound and color processing are omitted.

The baseband video signal S1 provided by source 12 is converted to a digital signal S2 for application to the video processing and display unit 14 by means of an analog to digital (A/D) converter 20 in a digital phase locked loop 16 (outlined in phantom) embodying the invention. The noise indicating signal (B0, B1) is applied to a control input of a picture enhancement processor 18 which is coupled to receive a video signal S3 from the display processor 14 and to supply an enhanced video signal S4 back to the display processor for display.

The purpose of processor 18 is to enhance one or more parameters of the displayed image and vary the enhancement as a function of the noise level as indicated by the two-bit noise indicating signal (B0, B1). To this end the enhancement processor 18 may be of conventional design and may provide, illustratively a desirable reduction in video bandwidth as the noise level increases, or it may apply "depeaking" under poor signal to noise ratio conditions. Other exemplary functions that may be provided by processor 18 include utilization of utilizes the noise signal to control both video peaking and the chrominance signal level. Another useful application of the noise signal would be for controlling the degree of noise reduction applied to video signals. It is apparent that many other suitable applications exist for the noise level indicating signal (B0, B1).

Digital phase locked loop 16 comprises the analog to digital (A/D) converter 20 to which the video signal S1 is applied and which supplies the converted (digital) video signal S2 to the processing and display unit 14 as previously mentioned. A phase locked sampling clock signal S5 of four times the color subcarrier frequency (4 Fsc) is provided to D/A converter 20, to a burst accumulator (or "quadrature phase detector") 22 and to a timing unit 24 by a voltage controlled oscillator 26. The timing unit 24 is synchronized with the "master clock" (S5) signal provided by VCO 26 and with deflection timing signals DFL from the video processing and display unit 14 for generating a number of timing signals for the phase locked loop 16 including horizontal synchronizing (HS), vertical synchronizing (VS) and burst gating (BG) signals.

Figure 2:
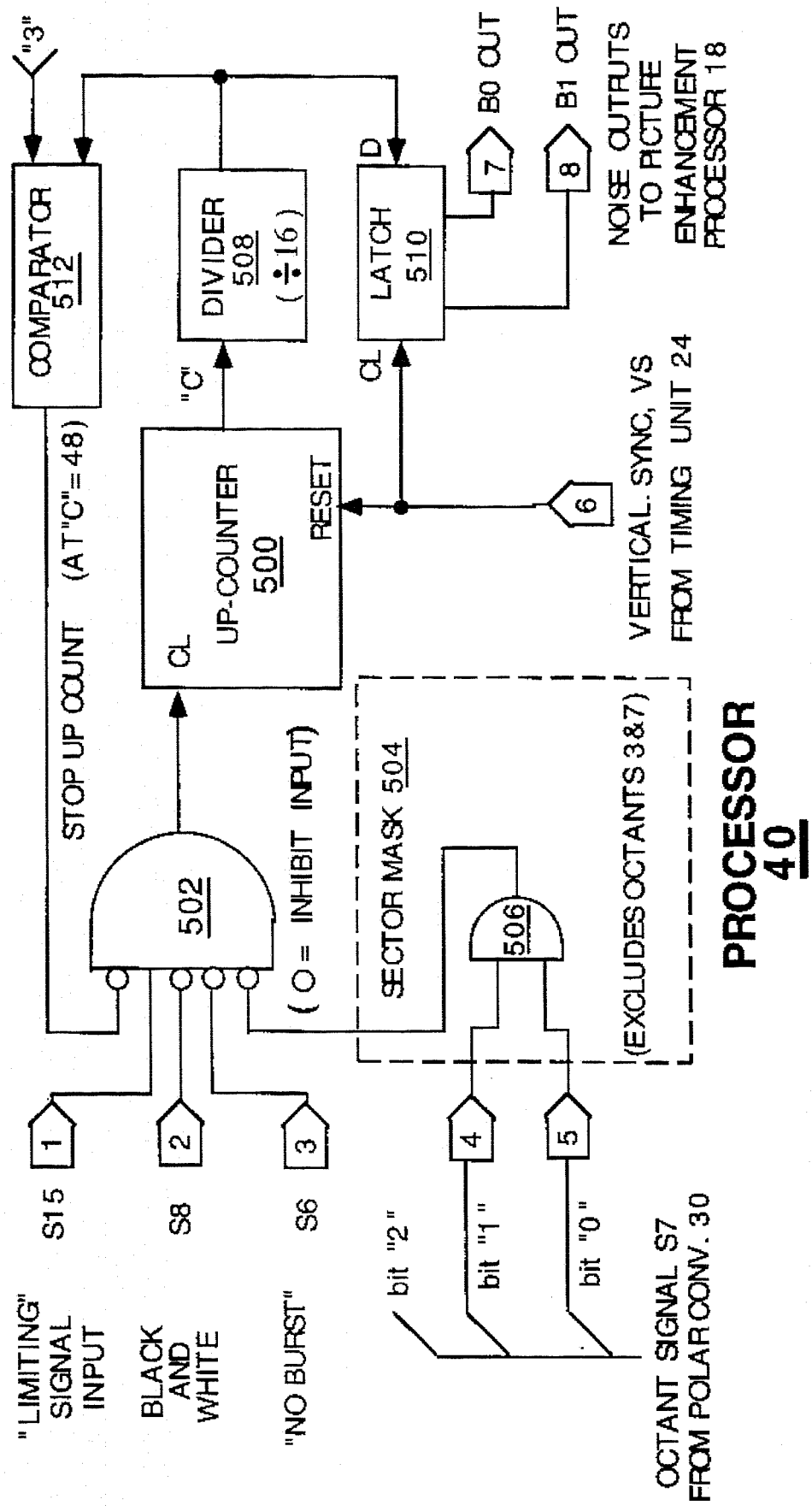
FIG. 2 is a detailed block diagram of an inhibitable counter suitable for use in the example of FIG. 1.

The burst gating signal BG, the 4 Fsc clock signal and the sampled video signal S2 are applied to the burst accumulator 22 which sorts and totalizes the even and odd samples of signal S2 occurring during the burst interval into two groups of samples. This includes an in-phase group of samples X (which occur at the burst peaks) and a quadrature phase group of samples Y (which occur at the burst zero crossings). The numbers X and Y represent the burst vector coordinates in a Cartesian (rectangular) coordinate system. An exemplary accumulator is shown in FIG. 2 and described later.

Figure 3:
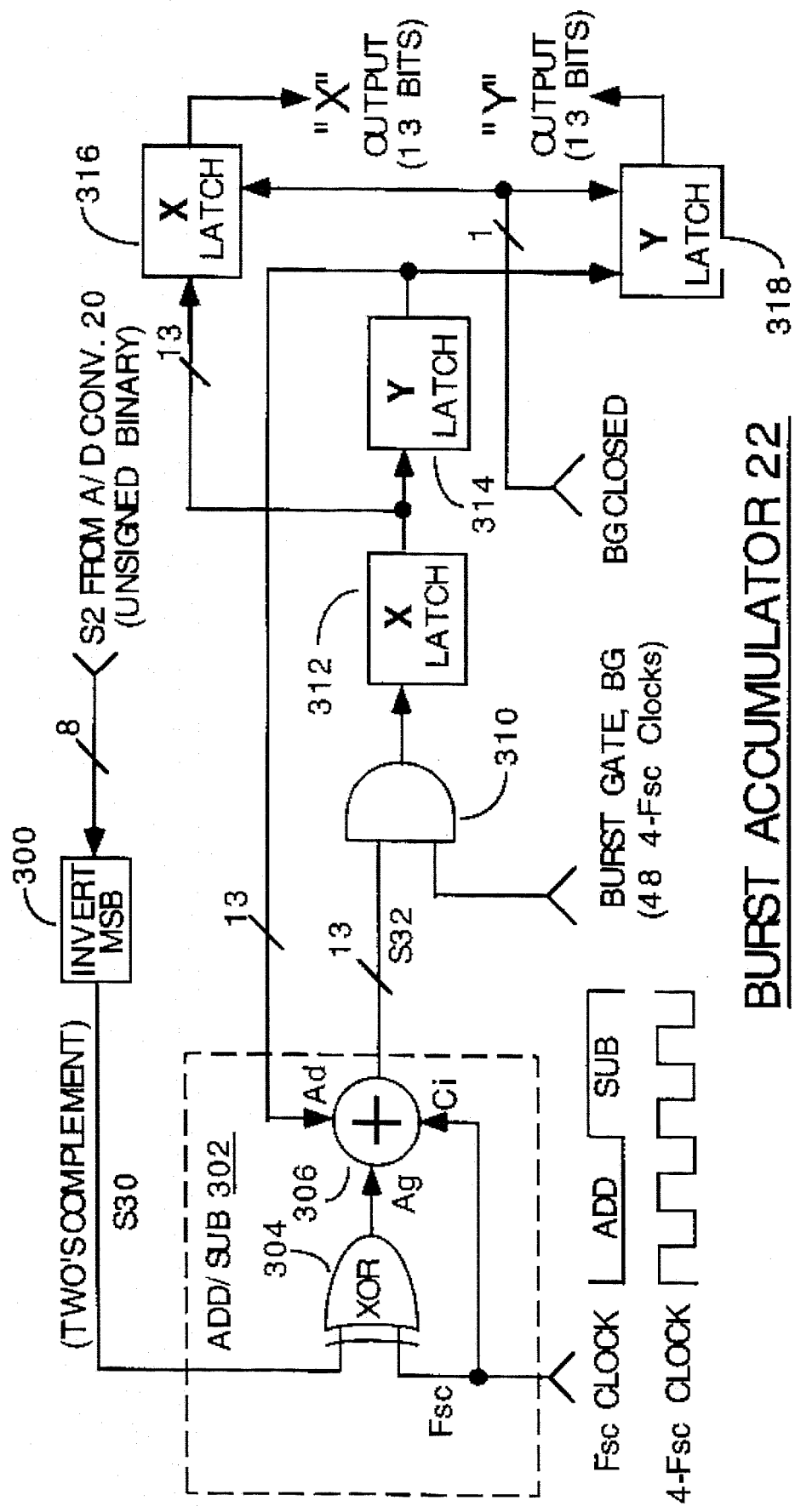
FIG. 3 is a detailed block diagram of a burst sample accumulator suitable for use in the apparatus of FIG. 1.

The X and Y coordinates of the burst vector are next applied to a polar to rectangular coordinate converter 30 which converts the XY coordinates from rectangular to polar coordinate form (R,φ) having a magnitude term R and a phase angle term φ. A direct approach to providing this conversion would be to apply the X and Y values to the address inputs of a read only memory (ROM) programmed with the corresponding radius and angle values. Such an arrangement, however, would require a relatively large memory. A better approach, which eliminates the need for a large memory, would be to calculate the angles using sine, cosine or tangent trigonometric approximations. FIG. 3 is exemplary of such a coordinate system converter (rectangular to polar) and is discussed in detail later.

The magnitude term R provided by polar converter 30 is applied to a burst detector 32 which outputs a signal S8 denoted "BLACK & WHITE" to an input of a burst phase jitter processor 40 when the video signal S1 includes no burst component thus indicating a black and white (monochrome) picture.

Two further signals generated by polar converter 30 are a NO-BURST signal S6 and an OCTANT signal S7, both of which are applied to respective inputs of the jitter processor 40. The "NO-BURST" signal is generated by a second burst detector which is located in the polar converter (and shown in FIG. 4) and detects the absence of individual bursts of the video signal S2. This information is needed by the jitter processor to inhibit processing during selected lines of a color video signal. For example, burst is not present during certain lines of the vertical interval (e.g., lines 1–9 when vertical sync is present). Individual bursts may be missing also in a color video signal during active video intervals due, for example, to loss of signal from noise, magnetic tape drop-outs or the like.

In brief summary, the system of FIG. 1 includes a pair of noise detectors. One of these detectors (32) is provided with a relatively long time constant or response speed (e.g., one field or more) for identifying black and white (monochrome) having no burst component at all. This detector inhibits the noise detection system for all monochrome video input signals. The other burst detector (310 in FIG. 3) is provided with a relatively short time constant or response speed (e.g., one line time) for identifying missing bursts on a line by line basis. In a color video signal some bursts are always missing, such as during lines 1–9 of the vertical interval, and some are occasionally missing, due to noise or tape drop-outs. To achieve an accurate estimate of noise in a color video signal, the missing bursts are detected and used to provide a modification of operation of the jitter processor 40.

Figures 6, 7:
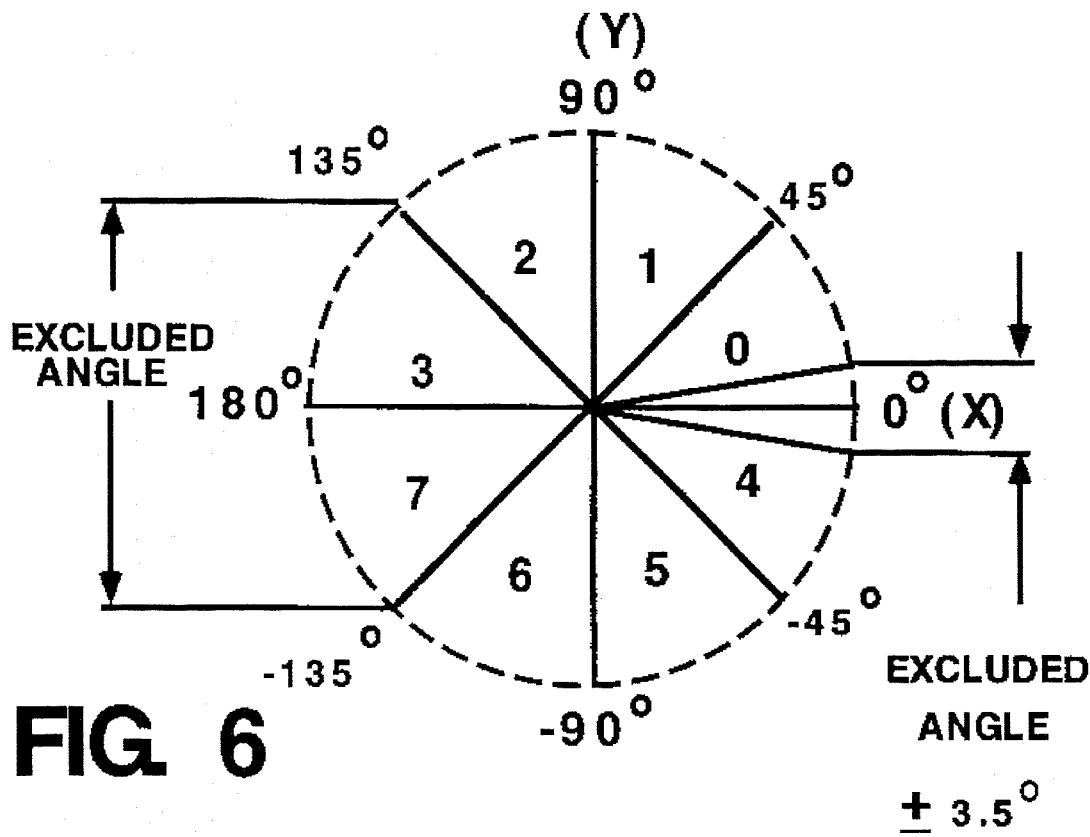
FIG. 6 is a phasor diagram illustrating certain aspects of operation of the example of FIG. 1.
FIG. 7 is a table illustrating operation of the rectangular to polar coordinate converter of FIG. 4.

As noted above, the polar converter 30 also outputs a signal called "OCTANT" to the jitter processor 40. The term octant, as used herein, means one eighth of a circle. For a circle expressed in terms of degrees, on octant would equal one eighth of 360 degrees or 45 degrees. For a circle expressed in radians, on octant would equal one eighth of two-Pi radians (e.g., Pi/4 radians). The octant signal comprises 3 bits and identifies which one of eight forty-five degree octants the burst vector angle occupies relative to the reference phase of the VCO 26. FIG. 6 illustrates the octants and the table of FIG. 7 lists the three-bit binary code identifying each 45 degree octant. As to the phase locked loop, the octant information is used in making an arctangent approximation to the burst angle as will be explained. The octant information also serves an additional purpose unrelated to the angle calculation. Specifically, the octant information also serves to inhibit processing of certain phase angles from the noise calculation.

As an example, the "OCTANT" (S7) signal inhibits processing in the jitter processor 40 for burst angles in the 45 degree octant from 135 degrees to 180 degrees and in the 45 degree octant from −135 degrees to 180 degrees (Octants 3 and 7, respectively). This prevents erroneous measurements of video noise being made in the presence of certain anti-copy coded video signals. An anti-copy coded video signal is one in which portions of the video signal are intentionally altered in a way that makes video taping of the signal difficult. One such "anti-copy" system reverses the burst phasing for four of every twenty video lines. By inhibiting processing of the burst phase noise signal in the two octants adjacent to 180 degrees, the anti-copy coded burst signal is prevented from interfering with the burst jitter measurement of video noise. As to the phase locked loop itself, other measures are taken to reduce the effects of burst phase inversions as discussed in detail later.

The phase angle signal $\phi$ (signal S9), produced by polar converter 30, is used for two purposes, namely, (i) for detection of noise in the video signal S1 and (ii) for phase locking VCO 26 to the burst component of the video signal S1. Specifically, phase signal $\phi$ provided by converter 30 is applied to an adder 40, to a frequency error detector 42 and to a lock detector 44. The output of the lock detector 44 is applied to a switch 46 that couples the frequency error output of detector 42 to another input of adder 40 when the lock detector indicates that the system is not locked. The frequency error detector 42 measures the rate of change of the phase signal $\phi$ from line to line and is, essentially, a differentiator and may be implemented by storing the phase of a previous line in a latch and subtracting the current and previous phase values to obtain the derivative with respect to time. Since the derivative of phase with respect to time equals frequency, the output of the frequency error detector is proportional to the frequency error when the system is not locked and is zero when locked. In the out-of-lock condition the lock detector 44 enables switch 46 to add the frequency error signal S10 to the phase angle signal S9 in adder 40. This "augmentation" of the phase angle signal when the loop is out of lock has been found to desirably enhance the speed of phase locking. Once locked however, lock detector 44 opens switch 46 removing the frequency error signal S10 from adder 40 and thereafter phase control is solely by means of the phase angle signal S9.

The output of adder 40, as noted above, comprises the burst phase angle signal S9 when the system is locked (switch 46 open) and comprises the sum of S9 and the frequency error signal S10 when the system is out of lock. The adder output signal S17 is applied to a limiter circuit 50 that which provides limiting and separates the limited phase angle signal into its sign S11 (positive or negative) and its magnitude S12 (the unsigned angle) and these signals S11 and S12, respectively, are applied to a binary rate multiplier 60.

The purpose of the binary rate multiplier 60 is to generate pulses of current for charging and discharging a capacitor in the loop filter 62 connected to the multiplier 60 to thereby control the frequency of oscillation of VCO 26. The number or rate of production of current pulses is proportional to the magnitude of the phase angle signal $\phi$. For example, when the sign signal S11 is positive, binary rate multiplier 60 generates positive current pulses (signal S13) for charging the loop capacitor and increasing the VCO frequency. Conversely, when the sign signal S11 is negative, multiplier 60 generates negative current pulses (signal S14) for discharging the loop capacitor and decreasing the VCO frequency. At lock the magnitude of the phase angle $\phi$ approaches zero and only enough pulses are produced to maintain a locked condition.

Figure 5:
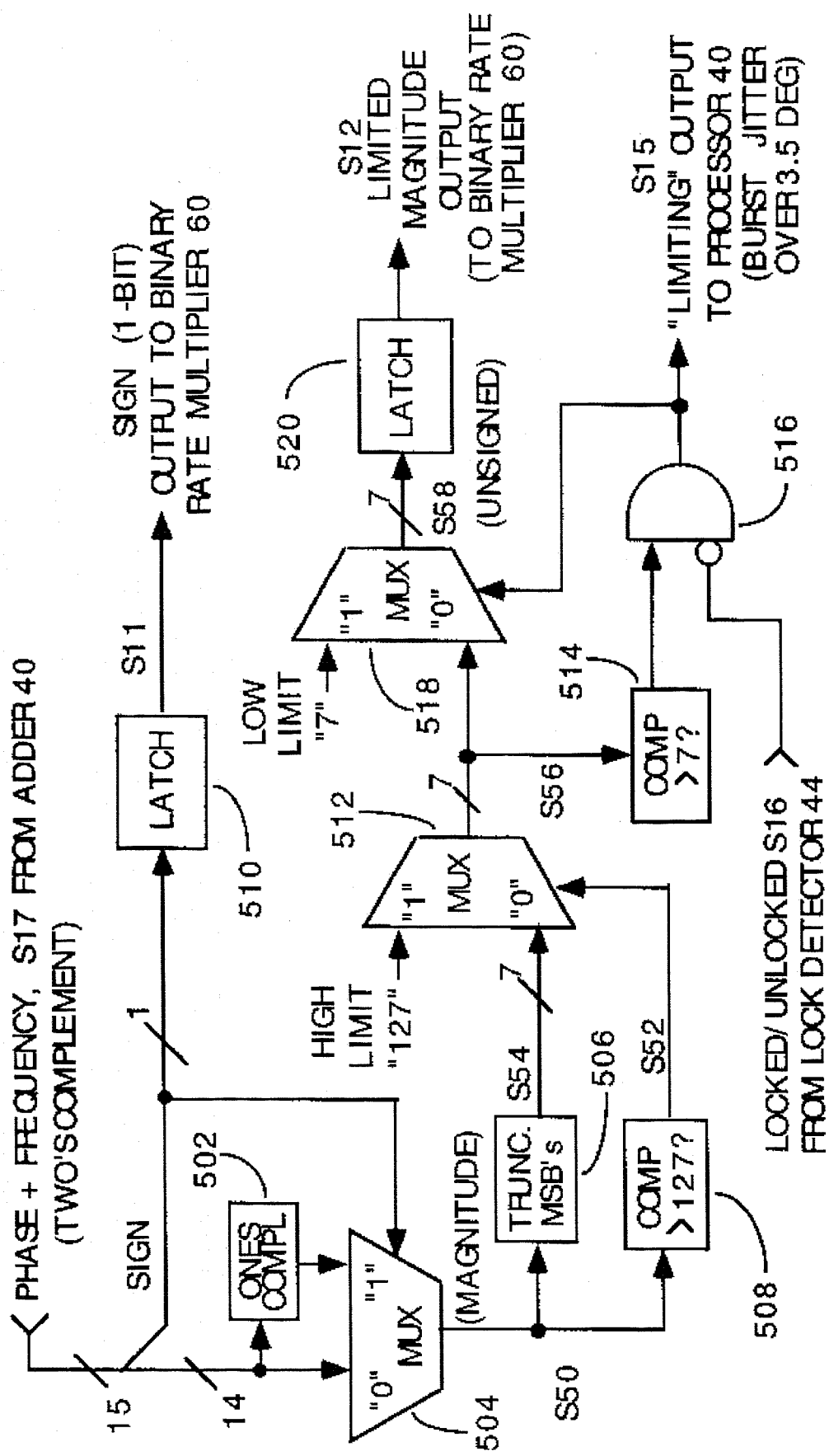
FIG. 5 is a detailed block diagram of a limiter suitable for use in the apparatus of FIG. 1.

One reason for limiting the phase angle signal $\phi$ in limiter 50 is to prevent large phase or frequency errors from overly influencing the loop operation. A further function provided by limiter 50 is to provide an indicator signal ("LIMITING") S15 to the jitter processor 40 that indicates when the limiter 50 is in a limiting condition. The "limiting" signal thus signifies that the system is locked and that the burst phase angle is greater than a predetermined minimum or limiting value. Under these conditions the magnitude signal S12 is limited thereby limiting the maximum charge or discharge currents for the loop filter 62. An exemplary "limiting" value when the system is locked is a phase angle of about 3.5 degrees. This angle has been found sufficient narrow to prevent burst phase inversions from disturbing the phase locked loop as discussed in detail later. When out of lock, the limiting level is increased (by a factor of ten or more) to enhance the speed of re-acquiring lock. A suitable implementation of limiter 50 is shown in FIG. 5 and discussed later.

The "limiting" signal S15 provided by limiter 50 is applied to the burst phase jitter processor 40. The combination of limiter 50 and processor 40, provides the function of deriving the noise indicating signal B0,B1 from the phase angle measurements provided by the polar converter 30.

In more detail, recall that limiter 50 detects burst phase errors that exceed a relatively small angle (e.g., 3.5 degrees) when the system is locked. The burst phase jitter processor provides the function of counting the number of lines in a given time interval (e.g., a field or frame) for which the phase angle measurement ($\phi$) exceeds the threshold angle of detection (3.5 degrees). From the count, the jitter processor 40 generates and outputs the count or a scaled version of it as the noise indicating signal. In this example, the count of burst phase excursions that exceed the threshold phase angle value and which occur within one field is scaled down to provide a two bit output signal (bits B0 and B1) which provide four discrete levels of noise indication (e.g., 00, 01, 10 and 11 in binary). The noise indicating signal is then applied to picture enhancement processor 18 for adjusting parameters of images displayed by unit 14 such as the contrast, sharpness, bandwidth or noise reduction as previously discussed.

FIG. 2 is a detailed block diagram of a suitable implementation of processor 40. Essentially, the processor 40 comprises a non-wrapping inhibitable field-rate up-counter the output of which is scaled down to the two most significant bits (MSBs) to form the noise indicating signal B0, B1.

Processor 40 includes six inputs and two outputs. Inputs 1, 2 and 3 receive, respectively the "limiting" signal S15, the "black and white" signal S8 and the "no burst" signal S6. Inputs 4 and 5 receive, respectively, the two least significant bits "1" and "0" of the octant indicating signal S7 and input 6 receives a vertical timing signal VS from the timing unit 24. The two outputs 7 and 8 provide the two bits B0 and B1 of the noise reduction signal to the picture enhancement processor 18.

Processor 40 includes an up-counter 500 the output of which is divided by 16 in a divider 508 and applied to an output latch 510 that provides the noise indicating output signal bits B0 and B1. The up-counter 500 is clocked by the limiting signal S15 via inhibitable AND gate 502. Each time the limiter 50 indicates a phase angle greater than the minimum value (e.g., 3.5 degrees when locked) the counter 500 is advanced. The counter 500 is reset once each field by means of the vertical sync signal VS which also latches the counter output in latch 510.

The output of counter 500 has been "scaled down" or divided by 16 in divider 508 to provide a more condensed presentation of the noise information. For example, a binary output value of "00" signifies that limiting has taken place less than 16 times during one field. An output of "01" signifies that limiting occurred at least 16 times but less than 32 times during one field. An output of "10" indicates that limiting has occurred at least 32 times but less than 48 times. Finally, an output of "11" signifies that limiting has taken place at least 48 times during a field.

It has been found that scaling the count down to provide the above four indications of the number of times the burst angle (or "jitter") has exceeded the acceptable minimum phase error (e.g., about 3.5 degrees) provides a useful number of noise level indications. If finer resolution is desired one may divide the output of counter 500 by a number smaller than 16. Maximum resolution may be obtained by taking the count "C" of the counter directly as the noise indicating signal.

In order to prevent the counter from "wrapping" or "overflowing" in cases where a large number of burst errors are made, the divided count is compared by a comparator 512 with a numerical value of "3" (binary "11"). This signifies that a count of 48 has been achieved in one field and the comparator output, being applied to an inhibit input (signified by an open circle) of AND gate 502, prevents further counting during the field.

The foregoing prevents "false low" indications of noise. For example, suppose that a very noisy video signal clocks counter 500 beyond its modulo. The counter output then, at the end of a field, might be any number. If that number is less than 16 then the noise signal will equal "00" signifying a relatively noise free condition when, in fact, just the opposite is true. Accordingly, comparator 512 prevents "wrapping" of counter 500 and so ensures that counter 500 can not count beyond a value of "48" no matter how many limit indications are provided by the limiter 50.

The foregoing discussion of the "non-wrapping" or overflow protection features of counter 500 illustrates one of four inhibiting conditions for the counter. The three other "inhibiting" conditions for counter 500 are (i) BLACK AND WHITE, (ii) NO BURST and (iii) SECTOR MASKING. Recall that monochrome video signals lack burst and so to avoid erroneous noise estimates the output of long time constant (field interval) burst detector (signal S8) which signifies that the video signal is monochrome is applied (at terminal 2) to a second inhibit input of AND gate 502. (Inhibit inputs are signified in the drawing by open circles at the gate inputs). The NO BURST signal S6 provided by a short time constant burst detector is also applied at input terminal 3 to another inhibit input of AND gate 502 to prevent counting during the vertical sync interval (when burst is absent) and to prevent counting otherwise defective bursts (e.g., burst missing due to tape oxide dropouts, etc.) with otherwise could yield an inaccurate count.

The last inhibiting condition of the counter 500 is applied for burst angles within a sector extending 45 degrees on either side of 180 degrees which corresponds to octants 3 and 7 (shown in FIG. 6) of the burst phase angle. This is referred to in the drawing as "sector masking" and its purpose, as previously explained, is to exclude all bursts from being counted which are likely to be intentionally reversed in phase by anti-copying video coding techniques. As previously noted, one such technique reverses burst phase for 4 of each 20 video lines. Excluding the reverse phased lines from the measurement preserves the integrity of the noise estimate.

The "sector mask" 504 (outlined in phantom) comprises a two input AND gate 506 which receives the two least significant bits ("1" and "0") of the octant signal S7. The complete octant code is shown in FIG. 7. This code identifies the sectors shown in FIG. 6 and determines the arithmetic processing used in the polar converter 30 for converting the quadrature samples X and Y into polar coordinates R and $\phi$. As seen from the code table, to cover a sector of 180 degrees plus or minus 45 degrees, one needs only to inhibit the counter 500 during two octants, namely octant 3 and octant 7. As is apparent from the three bit binary code table, the least significant two bits of octants 3 and 7 are both logic "ones". Thus by ANDing the least significant bits of the octant code, the gate 506 will be enabled any time the octant code is either "3" (011 in binary) or "7" (111 in binary). The output of gate 506 is therefore connected to an inhibit input of the gate 502 whereby counting is inhibited whenever the burst phase angle is in the "excluded" sector (octants 3 or 7).

FIG. 3 is a detailed logic diagram of a suitable implementation of the burst accumulator (or quadrature phase detector) 22 of FIG. 1. Reviewing briefly, the function of the accumulator is to sample burst at four times the color subcarrier frequency (4 Fsc) thus producing one sample for each 90 degrees of the burst signal. When the loop is locked, the even samples occur at the peaks of the burst thus forming the "in-phase" or "X" samples and the odd samples occur at axis crossings of burst to form the "quadrature phase" or "Y" samples. Taken together, these two values, X and Y represent the burst vector in a rectangular coordinate system. The function of the accumulator 22 is to perform the necessary arithmetic operations for properly sorting and totalizing the samples including removal of the direct current (DC) component or "pedestal" value (e.g., around black level) from the burst samples produced by the A/D converter 20.

In more detail, the video signal samples produced by A/D converter 20 are in the form of unsigned binary. Since burst appears during the trailing portion of horizontal sync, it will have a DC or pedestal value around black level. The exact value may be unknown or may vary with the signal source. To remove this component from the burst measurements, the video signal S2 from A/D converter 20 is first converted from unsigned binary to a two's complement form by inverting the most significant bit (MSB) by means of an inverter 300. This change in arithmetic form facilitates addition and subtraction of samples in the accumulator.

The two's complement samples from the inverter 300 are next applied to an adder/subtractor 302 comprising an exclusive OR gate 304 and a full adder 306. Selection of addition or subtraction modes is controlled by a clock signal Fsc at the color subcarrier rate which is one fourth of the 4-Fsc clock rate of the VCO 26. The adder/subtractor output is stored in two series connected latches 312 and 314 and fed back to the adder addend input. By clocking the latches at the 4 Fsc sample rate and changing from addition to subtraction every two sample periods using the Fsc clock, the in-phase samples "X" will be accumulated in latch 312 and the quadrature phase samples "Y" will be accumulated in latch 314. Since the adder/subtractor alternates between addition and subtraction every two sample periods of the 4 Fsc clock, the "X" samples are alternately added and subtracted to produce the accumulated "X" value in latch 312. It is the alternate addition and subtraction of the X value samples (e.g., +X0,−X2, +X4,ΔX6, +X8,−X10 etc.) which results in cancellation of the DC component of X. The burst component of X does not cancel because the burst "sign" or polarity alternates every two samples and so the burst samples add. Accordingly, the burst samples accumulate and the DC component or pedestal portion of the samples simply cancel. The same result occurs for the Y samples.

To confine the X and Y samples to burst only, the output of adder 306 (a 13 bit sum) is applied to the accumulator latch 312 via a burst gate 310 which is enabled for 48 of the 4-Fsc clock periods during the burst interval of each line. A typical burst (NTSC) will have 8 complete cycles corresponding to 32 samples of the 4-Fsc clock. The burst gate is intentionally made substantially wider than the burst width to ensure capture of all the burst cycles in the event of substantial timing errors in the video source.

At the end of the burst gating period (48 samples of the 4-Fsc clock) a burst gate closed signal (provided by timing unit 24) is applied to latches 316 and 318 which store the accumulated burst vector data X and Y for the remainder of the line during which time the data is converted to polar form, passed through limiter 50 and the noise estimate is made by counting the number of times the limiter limit is exceeded as previously explained.

Figure 4:
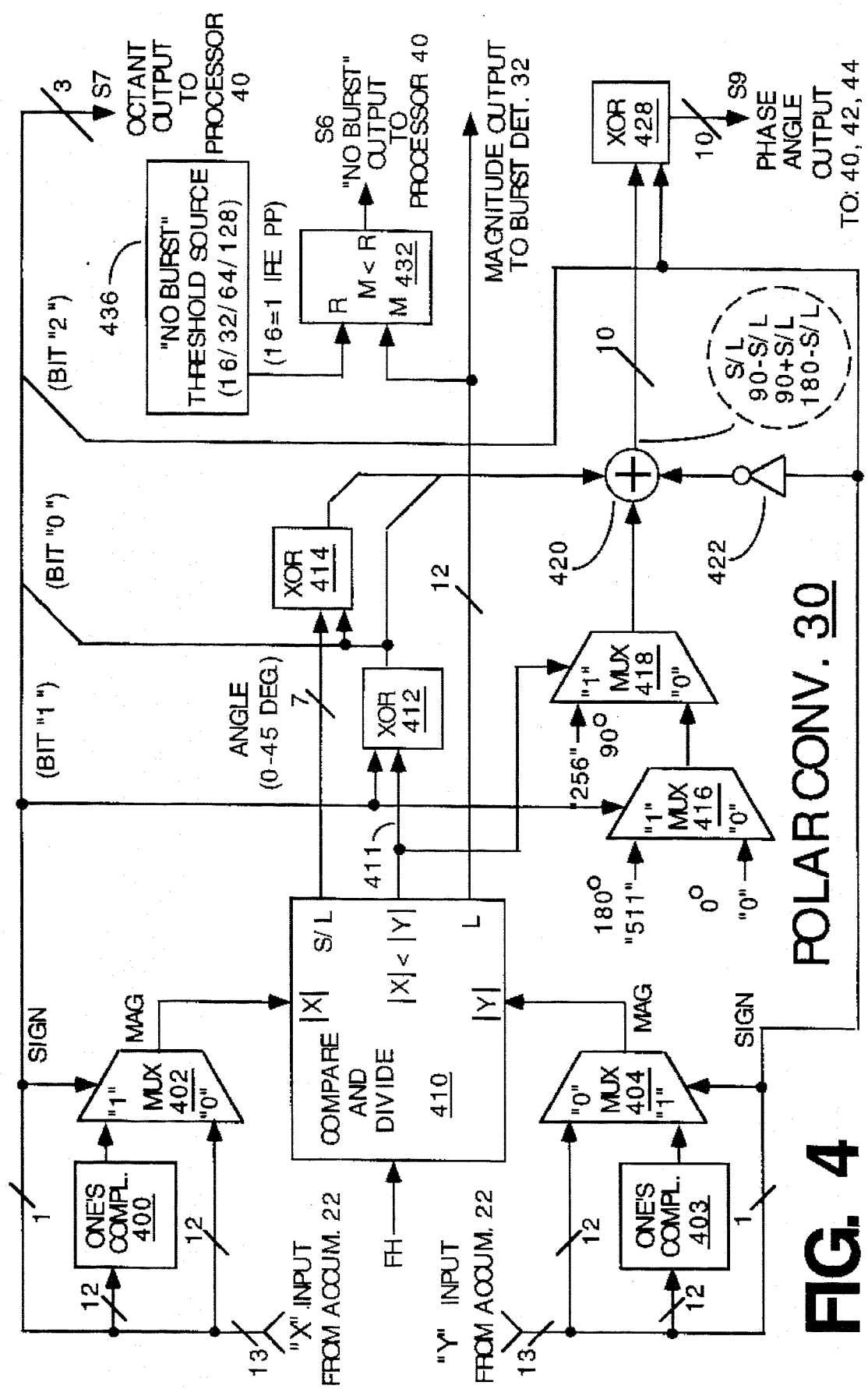
FIG. 4 is a detailed block diagram of a rectangular to polar coordinate converter suitable for use in the apparatus of FIG. 1.

FIG. 4 is a detailed logic diagram illustrating the polar converter 30 which provides the functions of: (i) conversion from rectangular to polar coordinate form (magnitude and angle) for the burst vector, (ii) identification of the specific octant the burst vector is in and (iii) generation of the "NO BURST" signal.

To provide polar conversion, the X and Y coordinates from accumulator 22 are applied to respective inputs of a comparison and division circuit 410 via respective one's complementor circuits each comprising a ones complementor or inverter (400 or 403) and a multiplex switch (402 or 404) controlled by the sign bit of the input signal. This converts the coordinates from two's complement to unsigned binary for ease of subsequent magnitude comparisons and division. For example, when the sign of X is "0" (bit 13, indicating a positive number), the remaining 12 bits of the magnitude of X are passed directly to the X input of circuit 410 via mux 402. If, however, the sign of X is negative (binary "1", indicating a negative number), then mux switch 402 couples the complemented 12 magnitude bits to the X input of circuit 410 thus converting X to unsigned binary form. The magnitude bits (e.g., 1–12) of the Y input signal are similarly converted to unsigned form under control of the Y sign bit (bit 13) for application to the Y input of the comparison and division circuit 410. Internally, the compare and divide circuit 410 includes a magnitude comparator for identifying the larger of X and Y and outputs this value as signal "L" (i.e., "larger"). The signal "L" is used to represent the "MAGNITUDE" of the polar burst vector S12 for application to the burst detector 30.

The polar magnitude signal "L" is also applied to a short time constant NO-BURST detector comprising a comparator 432 which compares signal "L" with a reference level signal provided by a NO BURST threshold source 436. For purposes of overall system adjustment, the threshold source 436 is programmable to provide a number of reference values. Illustratively, burst reference values of 16, 32, 64 and 128 are available. In terms of IRE signal levels, these correspond to burst amplitudes of 1, 2, 4 and 8 IRE levels. The comparator compares signal "L", (which is the "larger" of the vector components X and Y), with the burst reference level provided by source 436 and outputs the NO-BURST signal S6 when the magnitude signal "L" is less than the burst reference signal R. As previously noted, the time constant of this burst detector is relatively short in that detection occurs on a line by line basis as compared with the long time constant burst detector 32 which has a field rate time constant for detecting monochrome video signals. The NO-BURST signal S6, as previously noted, inhibits the calculation of the video noise level for lines with burst missing such as the lines of vertical sync and lines with burst drop outs.

Identification of specific octants of the burst vector is provided by a three bit octant identifications signal S7. The most significant bit comprises the sign bit of the "Y" input signal. The second most significant bit B1 comprises the sign bit of the "X" input signal. The lease significant bit LSB comprises the exclusive OR of the sign bit of the "X" input signal with the output of the X<Y magnitude comparator in circuit 410. FIG. 7, as previously noted, identifies the octants 0–7 in terms of this three bit code. Reviewing briefly, the lower two bits of the octant code are AND'ed in sector mask 504 to exclude bursts from the noise calculation near 180 degrees (+/–45 degrees) to prevent errors from video material from anti-copy protected tapes of the type in which burst is periodically inverted.

Considering now the details of the polar conversion function of converter 30, this conversion is based on an approximation that for small angles (e.g., below 45 degrees) the arctangent of the angle defined by the rectangular coordinates X and Y is approximately equal to the smaller of X and Y divided by the larger of X and Y. Circuit 410 includes a magnitude detector, as previously explained, which determines the relative sizes of X and Y. This detector is used internally to perform a division of the smaller of the larger signal (signified as "S/L") and this number is used to represent the 7 least significant bits of the polar angle which cover a range of 45 degrees. To cover a full circle (360 degrees) the converter 30 adds or subtracts angles of 0, 90, or 180 degrees depending upon the octant the burst vector is in. The octants are determined as described above and the arithmetic of deriving the full value for each octant is shown in FIG. 7.

In more detail, the arithmetic calculations of FIG. 7 for the burst vector angle are performed in converter 30 by a full adder 420 which by means of exclusive OR gate 414 and inverter 422 is capable of either addition or subtraction. Two multiplex switches are provided 416 and 418 which provide the numerical equivalent of fixed angles of 0, 90 and 180 degrees to one input of the adder 420. By selecting the appropriate fixed angle, and arithmetically combining (e.g., adding or subtracting) it with the arctangent approximation of the burst angle (the signal S/L), any burst angle in octants 0–3 can be represented. The remaining octants 4–7 are calculated by inverting the corresponding one of the octants 0–3. This is done by the exclusive OR gate 428 connected to the output of adder 420.

As an example of calculation of the burst angle, assume that the vectors X and Y are both positive and X is larger than Y. This defines a burst vector in octant "0" which lies between zero and forty five degrees and whose angular value is approximately equal to Y/X (the smaller divided by the larger). Since X is positive, the multiplex switch 416 will select the constant "zero" as an output which corresponds to zero angular degrees. Since it is assumed that X is larger than Y the comparator signal X<Y will also be zero thus causing multiplex switch 418 to select the output of switch 416 which is zero degrees, as previously noted. Adder 420, for this condition adds a constant of zero (from switches 416 and 418) to the arctangent approximation (S/L) from compare and divide circuit 410 and since the sign of Y is zero (Y is positive) the output exclusive OR gate 428 will pass this value (+S/L) as the burst phase angle S9.

For different octants adder 420 adds different constants to S/L as shown in the inset dashed circle at the adder output and shown also in the table of FIG. 7. For example, for a burst vector lying in octant 1, the complete vector angle is the value of S/L subtracted from the 90 degree reference provided by switch 416. In octant 2 the 90 degree value is added to the S/L value and in octant 3 the burst vector is determined by subtracting the S/L value from 180 degrees. For the remaining octants 4–7, the value of the burst vector is found exactly as for the corresponding octants 0–3 except that the output of the adder 420 is inverted by exclusive OR gate 428 thus reversing the sign of the indicated burst phase angle.

FIG. 5 is a detailed logic diagram of the limiter 50. This unit converts the burst vector error signal (i.e., the phase plus frequency signal S17) into sign and magnitude format and provides dual mode limiting action. It limits the error signal magnitude to "7" when the system is locked and to a level of "127" when the system is unlocked. The binary values of 7 and 127 correspond, in terms of burst phase angular degrees to about 3.5 degrees and 63 degrees, respectively. Advantageously, providing a wider range of burst phase error angles before limiting is reached for the unlocked condition provides further enhancement in lock acquisition speed in addition to the speed enhancement provided by the frequency term (S10) that is added to the phase term (S9) by adder 40 when the loop is in the unlocked condition. Conversely, the narrow range of 3.5 degrees has been found to be effective in counteracting the undesirable effects of burst phase inversions as discussed in detail later.

In limiter 50 the phase plus frequency signal S17 from adder 40 is converted from two's complement form to unsigned binary by means of a ones' complementor 502 and a multiplex switch 504. The switch 504 is controlled by the sign bit of the input signal to select the 14 magnitude bits as an output (S50) when the sign bit is zero (indicating a positive number) and to select the output of the ones complementor 502 when the sign bit is "1" (signifying a negative number) thus producing an unsigned binary output signal S50. The sign bit of the input signal (bit 15) is also stored in a latch 510 so as to provide the sign bit signal S11 for use by the binary rate multiplier in determining the polarity of output current (current 18 or current sinking) to the loop filter.

The unsigned binary phase angle signal S50 is applied to a comparator 508 which a multiplex switch 512 to select the seven least significant bits of signal S50 (provided by a truncator 605) when signal S50 is greater than a value of "127", otherwise, switch 512 selects a constant "high limit" value of "127" as the output. This portion of the circuit thus provides a first level of limiting of the burst phase angle signal to a level of "127". If, for example, the burst phase angle is any value less than 127, then comparator 508 will select the truncated signal S54 as the output signal S56 of switch 512. Conversely, any value of burst angle greater than 127 will cause switch 512 to select the reference value of "127" as the output signal S56.

A second stage of limiting of the signal S56 is provided by a comparator 514, an inhibit AND gate 516 and a second multiplex switch 518. Specifically, comparator 514 compares the burst angle signal S56 with a reference level of "7" and provides a high output if signal S56 is greater than the value of 7. The gate 516 receives the output of comparator 514 and is enabled by lock detector 44 when the lock detector output is low signifying an "locked" condition of the loop. If the input signal S56 is less than a value of "7", and the loop is locked, then switch 518 will select the signal S56 as the burst phase angle. If the input signal is greater than 7, and the loop is locked, gate 516 will cause switch 518 to select a fixed limiting value of "7" as an output thus limiting the burst phase angle to about 3.5 degrees which the loop is locked. However, if the loop is unlocked, gate 516 will cause switch 518 to select the signal S56 (which has a limiting level of 127) as the output burst vector angle. A latch 520 is provided for storing the burst vector angle signal S12.

Reviewing briefly, the gate 516 provides the "limiting" output signal S15 for processor 40. This signal will be high if the loop is locked and the burst angle is greater than the reference value of "7" which corresponds to a burst phase angle of about 3.5 degrees. The "limiting" output signal will be low if the loop is not locked or if the burst phase angle error is below the limiting value of "7" which corresponds approximately, to a burst phase error of 3.5 degrees. Processor 40, as previously explained, tallies the number of times limiting has taken place when the loop is locked for developing the video noise level indicating signal (B0,B1).

Figure 8:
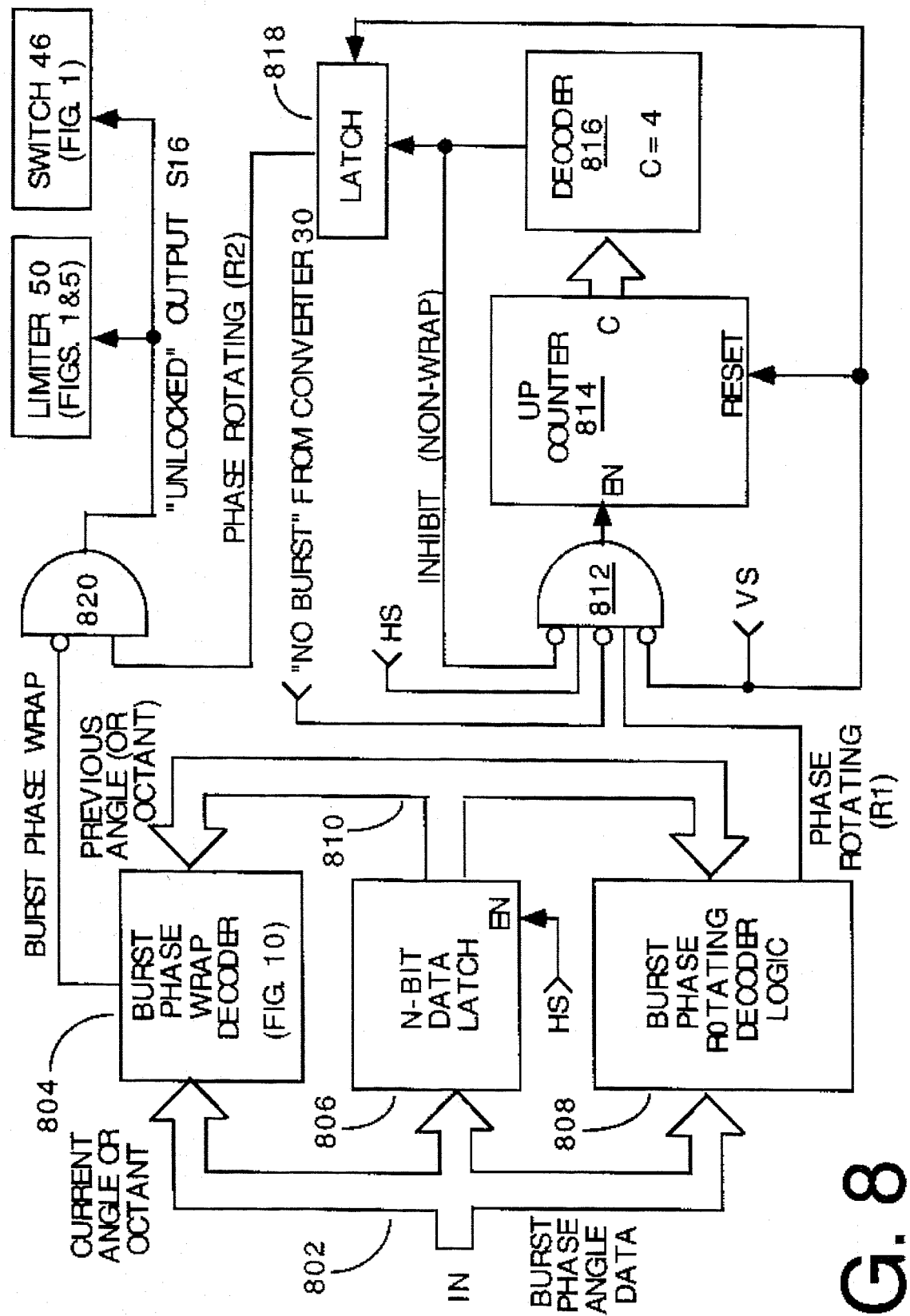
FIG. 8 is a detailed block diagram of a lock detector suitable for use in the phase locked loop of FIG. 1.

FIG. 8 is a detailed block diagram of the lock detector 44 which controls the limiting levels or the "phase angle window" of the limiter 50. Recall that limiter 50 has two operating modes. When unlocked, the limiting level corresponds to burst phase error limits of plus or minus about 60 degrees. This relatively wide range facilitates rapid lock acquisition by effectively decreasing the loop time constant. The acquisition of lock is further enhanced when the limiter reduces the loop time constant the lock detector also closes switch 46 which adds the frequency term S10 to the phase term S9. When locked, the detector 44 disables the frequency term by opening switch 44 and concurrently reduces the limiting level to the range of plus or minus 3.5 degrees thus substantially increasing the loop time constant. This range is quite narrow and has been found to be effective in reducing noise and in limiting the effect of the inverted bursts used in anti-copy coding. Stated another way, when lock is established loop time constant is increased and there is no signal that can produce a transient change in the burst error vector beyond 3.5 degrees. As a result, phase angle errors beyond 3.5 degrees have little effect on the operation of the VCO 26 and the oscillator output remains stable in the presence of noise or burst inversions.

The circuit which controls the width or "aperture" of the "phase angle window" comprises the lock detector 44. This circuit is also provided with protection against inverted bursts. Briefly stated, this added inverted burst protection is achieved by the combination of (i) testing the phase error vector (signal S17) for phase rotation and (ii) restricting the angles for the rotation test to phase angles that the anti-copy coding never uses, namely, plus and minus 90 degrees or windows centered with respect to the vertical axis of the phase error plane (e.g., the Y axis in FIG. 6). Recall that in the prior art lock detector operated by counting the number of times accumulated in-phase samples change polarity during a field and comparing the count to a threshold value. Such an approach to lock detection has been found to be susceptible to anti-copy reverse phase bursts with the result that the lock detector can erroneously produce a false "out of lock" signal which, if not prevented, could open the aperture or window discussed above and thus produce a large VCO transient. In turn, the transient may actually cause the loop to lose phase lock. Such false "out of lock" detections are avoided in detector 44 by testing for phase error vector rotation rather than counting sign reversals of the in-phase component as in the prior art example. Additional rejection of false out of lock indications is provided by restricting the rotation test to zones or angles that inverted bursts do not occupy.

A further feature of detector 44 in FIG. 8 also relates to minimization of false "out of lock" indications due not to inverted bursts but rather to the mechanics of arithmetic processing. This feature is called burst phase error "wrap" detection and is implemented in a detector 804 by examination of the left half plane of the phase error plane (see FIG. 6) to determine if the phase error vector has passed from +180 degrees to −180 degrees or vice versa. This is called phase "wrapping" because it represents a phase change in excess of the angular range of the polar converter 30 which provides polar conversions over a range of 360 degrees from −180 to +180 degrees. Stated another way, phase error changes beyond 180 degrees will "wrap" around the phase plane limits and thus may introduce false phase error indications. (The wrapping effect is somewhat like forcing a counter to count beyond its modulo so that the count passes its maximum and "wraps" around to begin counting at zero.)

Phase wrapping effects in the lock detector 44 may occur, however, they are prevented from disturbing the loop by detecting when a wrap has occurred and immediately sending a "phase locked" signal to the limiter 50. By this means, the maximum disturbance to the overall loop is limited to the lowest limiting level of the limiter 50 which is about 3.5 degrees. If the phase wrapping feature of lock detector is omitted, the maximum phase error due to wrapping is the highest limiting level of the limiter 50 which, in this example, is 60 degrees.

Now considering the details of FIG. 8, the burst phase angle data from polar converter 30 is applied via bus 802 to a burst phase wrap decoder 804, to an N-bit data latch 806 (which, as shown, is updated by the horizontal synchronizing signal HS at the horizontal line rate) and to a burst phase rotating detector 808. As previously noted the burst phase data may comprise a full (13 bit) binary word representing the phase error vector angle (signal S9) to high resolution. If so, the bus 802 would be connected to the signal S9 output of converter 30 as indicated by the dashed line 101 in FIG. 1 and the N-bit latch 806 would have a 13 bit capacity. However, such high high precision (13 bits) is not necessary for the purposes of detecting wrapping or rotation and so the lower resolution octant representations of the phase angle are used in the lock detector 44. For selecting octant phase angle data, the input bus 802 is connected to the octant signal output (S6) of converter 30, as indicated by the solid line 100 in FIG. 1. For octant data the N-bit data latch 806 only requires a 3-bit storage capacity since only 3 bits are required to identify all eight octants as shown in FIG. 7. Using the octant data desirably simplifies the hardware required for implementing the burst phase wrap detector, the N-bit latch and the burst phase rotating detector.

The burst phase wrap and rotation detectors both require phase information from the current and previous lines. The bus 802 provides the current phase error angle (octant in this case) data from polar converter 30. The phase information from the previous line is provided by latch 806 which stores the burst angle or octant of the previous line and this data is provided to the decoders 804 and 808 via data bus 810.

The burst phase rotating decoder 808 compares the current burst phase angle on bus 802 with that of the previous line on bus 810 and determines if the burst error vector is rotating in either the clockwise direction or the counter-clockwise direction. Rotation of the burst error phase may be used to indicate an unlocked condition of the loop if one selects some particular octants or angles. For example, one can not test the burst error vector at an angle of zero degrees for rotation since the vector will normally be in the vicinity of zero degrees when the loop is locked and thus would appear to be rotating almost all the time. It is recognized herein that the burst error vector can not be tested either for rotation at an angle of 180 degrees since that angle is within the expected range of bursts which have been inverted by the aforementioned anti-copy coding system. To avoid detection errors due to burst phase inversions, the rotation test is made in detector 808 only for burst angles in the vicinity of plus or minus 90 degrees. In terms of octants, this corresponds to burst phase angles passing from octant 1 to octant 2 and vice versa, and to burst angles passing from octant 5 to octant 6 and vice versa. This restriction to detection of rotation near angles of plus or minus 90 degrees, to the exclusion of angles near zero and 180 degrees provides a further degree of protection for the loop from disturbances by anti-copy coding of the type employing periodic burst inversion. This protection is in addition to that provided by the very narrow phase error window of plus or minus 3.5 degrees which is provided by the limiter 50 when in the narrow range limiting mode.

Figure 9:
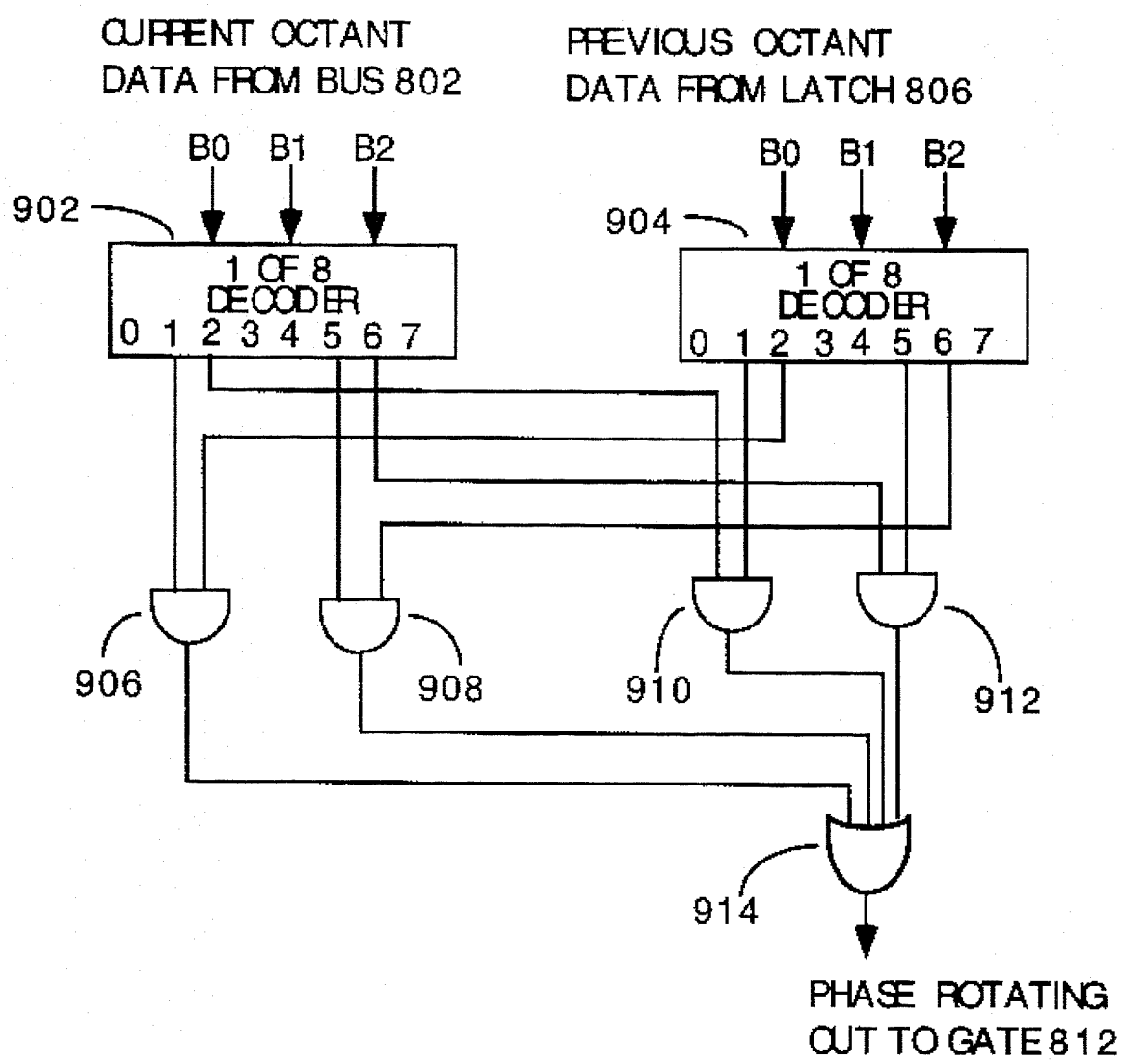
FIG. 9 is a detailed logic diagram of a phase error rotation detector suitable for use in the lock detector of FIG. 8.

Logic suitable for implementing the phase rotating detector, using octant angular data, is shown in FIG. 9. As shown, the octant data from the current and previous fields is decoded in decoders 902 and 904. The AND gate 906 determines clockwise vector rotation across the angle +90 degrees by determining if the current octant is "1" and the previous octant (from decoder 904) was "2". The AND gate 910 determines counter-clockwise rotation at +90 degrees by determining if the current octant is "2" and the previous octant was "1". In a similar fashion, AND gates 908 and 912 determine rotation about the −90 degree axis and the outputs of all of the AND gates are combined in a four input OR gate 914. This output will be high if any AND gate output is high thereby signifying that rotation has occurred for burst phase errors near 90 degrees or −90 degrees in either clockwise or counter-clockwise directions.

Returning to FIG. 8, if phase rotation is detected by decoder 808, it is an indication that the oscillator and burst frequencies are different and so the loop is in an unlocked condition. The phase rotation signal (R1) could be used directly for controlling the limiting levels of limiter 50. However, a "false" unlock indication from the lock detector can have very undesirable consequences. Specifically, false unlock indications concurrently raise the limiting level to an angle of 60 degrees and closes switch 46 which adds the frequency error term to the phase error term. The effect is that a transient may be produced and, worse still, the transient may be large enough to unlock a loop that previously was locked, all because of a "false" indication that the loop was unlocked to start with.

To minimize the possibility of false unlock indications due to erroneous indications of phase rotation, the phase rotating signal R1 from decoder 808 is applied to a non-wrapping, modulo 4 counter which requires that 4 rotation detections occur within one field to generate an output phase rotating signal R2. This substantially increases the degree of confidence for detector 44 that the phase rotations are valid.

The phase error rotation counter comprises AND gate that passes the phase rotation signal R1 to the enable or clock input of a modulo four up counter 814 that is reset by the vertical signal VS once each field. If the up counter 814 count "C" equals four counts, decoder 816 will supply an inhibit or "non-wrap" signal to gate 812 that stops the counter from counting any more rotation pulses. This prevents the counter from "wrapping" or exceeding its modulo (4) which otherwise could give erroneous results. Gate 812 is also inhibited by the "no burst" signal from converter 30 to prevent possibly erroneous rotation indications when burst is absent from being counted. Gate 812 is synchronized for clocking counter 814 by means of a line rate (horizontal synchronizing) pulse HS and is inhibited during the vertical interval by means of the vertical synchronizing signal VS.

The output of decoder 816 will be high if 4 rotations have occurred during a field thus signifying an out of lock condition and will be low otherwise. The rotation signal (R2), with a confidence level enhanced by counting rotations per field, is stored in a latch 818 at the end of each field by means of the vertical signal VS and is coupled to the limiter 50 via AND gate 820. When R2 indicates an out of lock condition, and the burst phase wrap signal applied to an inhibit input of gate 820 is low, the limiter 50 range is increased from plus or minus 3.5 degrees to plus or minus about 60 degrees and the frequency term S10 is added to the phase error term S9 thus enabling rapid re-locking. Conversely, if either the burst phase wrap signal is high or if the phase rotating signal is low, the gate 820 will reduce the limiting level of limiter 50 to 3.5 degrees and disable the frequency error term.

Considering now the details of the burst phase wrap decoder 804, recall that the function of this circuit is to force the output of the lock detector 44 to a "locked" indication whenever the burst phase error vector passes from +180 to −180 degrees or vice versa. One may make this determination by comparing the current and previous phase angles using the full (13 bit) resolution of the polar converter 30. A better way is to divide the phase error plane into octants to determine if wrapping has occurred because the logic is much less complex. The logic, using octants to represent the phase angles, is defined by the following conditions:

1. The current octant is in the left half plane; and
2. the current octant and the previous octant are in opposite upper and lower half-planes.

Figure 10:
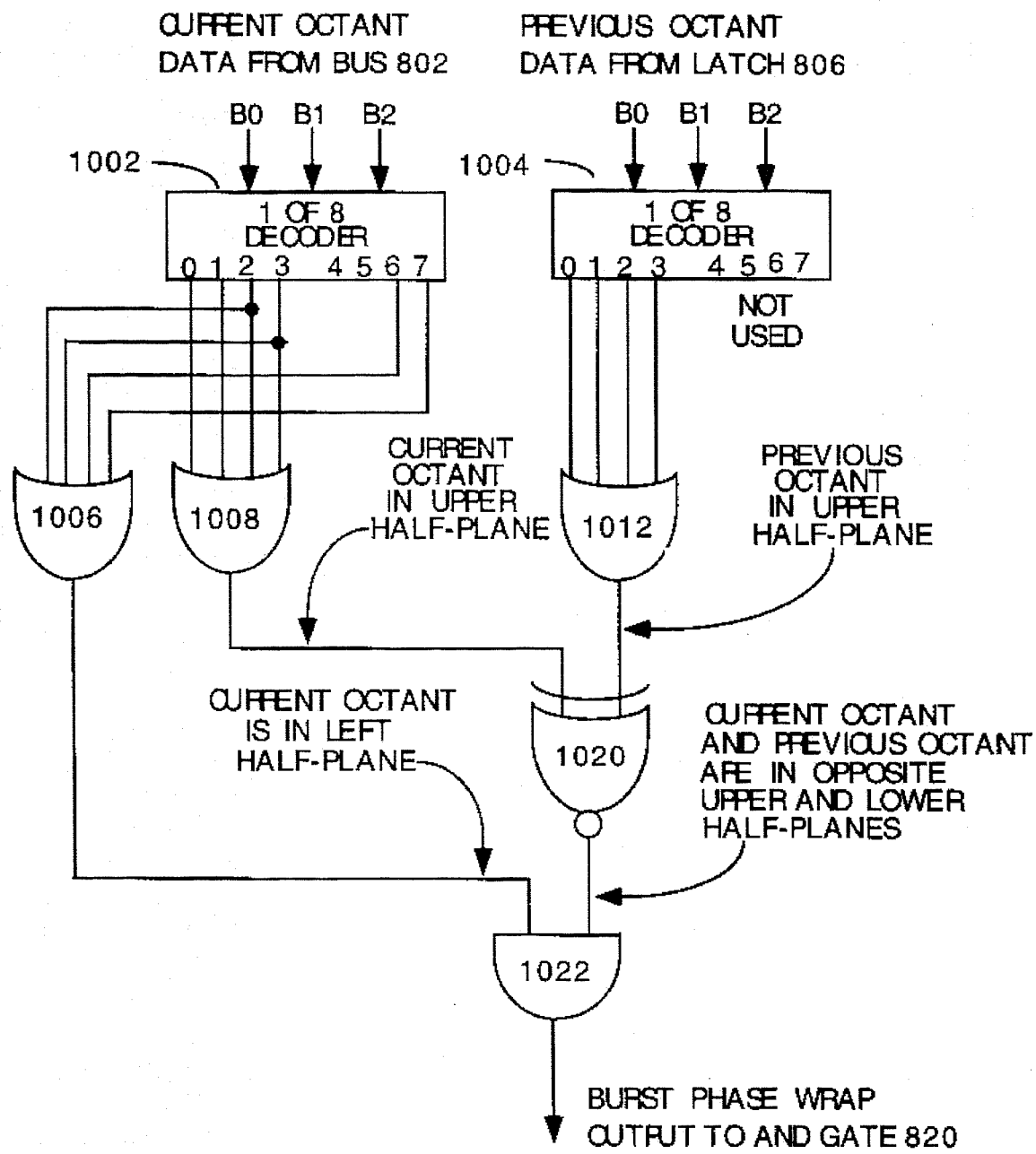
FIG. 10 is a detailed logic diagram of a burst phase wrap detector suitable for use in the lock detector of FIG. 8.

FIG. 10 illustrates one way of implementing the decoding logic for detecting burst phase error wrap. In FIG. 10 the current and previous 3-bit binary octant data from bus 802 and bus 810 is decoded to decimal form by respective decoders 1002 and 1004.

Condition (1) referred to above is determined by an OR gate 1006 which is connected to the 2, 3, 6, and 7 octant outputs of decoder 1002. From FIG. 6, these octants are all of the octants in the left half-plane and so the output of OR gate 1006 will be high if the vector is anywhere in the left half-plane.

Condition (2) of the phase wrap logic decoder is detected by two OR gates 1008 and 1012 and an exclusive NOR gate 1020. Gate 1008 is enabled to produce a high output if the current octant is in any one of octants 0, 1, 2, and 3. These are all of the upper half-plane so a high output of gate 1008 signifies if the current octant is in the upper half-plane. Gate 1012 performs a similar function for the previous octant. Specifically, if the previous burst phase error vector was in the upper half plane, then the output of OR gate 1012 will go high. An EXCLUSIVE-NOR gate 1020 combines the outputs of gates 1008 and 1012. If the previous and the current octants were in the upper half plane, OR if neither of the previous and current octants were in the upper half-plane, then the output,of the EX-NOR gate 1020 will be low. Accordingly, the output will be high if the current octant and the previous octant are in opposite upper and lower half-planes. This satisfies condition (2) above.

A combined output signal is provided by AND gate 1022 which receives the outputs of OR gate 1006 and EX-NOR gate 1020 and provides a high output signal signifying a burst phase wrap condition when both of conditions (1) and (2) are satisfied. Stated another way, gate 1022 will produce a high output signal if the burst phase error vector passes in either direction past 180 degrees. As previously noted, this wrap condition forces the output of gate 820 low signifying a locked condition which forces the limiter level to its narrow value (3.5 degrees) and disables the frequency error term.

What is claimed is:

1. Phase locked loop apparatus for generating an oscillatory signal phase locked to a component of a further signal, comprising:

a variable oscillator for generating the oscillatory signal;

a source for providing the further signal;

a phase detector responsive to the oscillatory signal and to the component of the further signal, for providing a phase error signal;

a limiter for limiting said phase error signal and for applying the resultant limited phase error signal to said variable oscillator for phase locking said oscillatory signal to said component of said further signal; and circuit means for varying the limiting level of the limiter.

2. Apparatus as in claim 1 wherein said circuit means comprises:

a phase rotation detector for varying said limiting level as a function of phase rotation of said component of said further signal relative to said oscillatory signal.

3. Apparatus as in claim 1 wherein said circuit means comprises:

a phase wrap detector for varying said limiting level as a function of phase wrapping of said component of said further signal relative to said oscillator signal.

4. Apparatus as in claim 1 wherein said circuit means comprises:

a rotation detector for detecting rotation of said component of said further signal relative to said oscillatory signal by comparison of current and previous phase angles, excluding at least one predetermined range of phase angles, for providing a limiting level control signal to said limiter.

5. Apparatus as in claim 4 wherein said excluded predetermined range of phase angles comprises at least one of (i) a range of phase angles including an angle of zero degrees and (ii) a range of phase angles including an angle of 180 degrees.

6. Apparatus as in claim 1 wherein said circuit means comprises:

a rotation detector for detecting rotation of said component of said further signal relative to said oscillatory signal by comparison of current and previous phase angles to provide a rotation indicator signal; and a counter for counting a number of rotation indicator signals occurring in a given time period for generating a limit level control signal for said limiter based on the count of said counter.

7. Apparatus as in claim 1 wherein said circuit means comprises:

a phase rotation detector for varying said limiting level as a function of phase rotation of said component of said further signal relative to said oscillatory signal; and a phase wrap detector for varying said limiting level as a function of phase wrapping of said component of said further signal relative to said oscillatory signal.

8. Apparatus as in claim 1 wherein said circuit means comprises:

a phase rotation detector for providing an indication of phase rotation of said phase error signal;

a phase wrap detector for providing an indication of phase wrapping of said phase error signal; and logic means jointly responsive to output signals of the rotation and wrap detectors for controlling said limiting level of said limiter.

9. Apparatus as in claim 1 wherein said circuit means comprises:

a logic circuit for comparing a current phase angle with a previous phase angle to provide a phase rotation signal;

a counter for counting the number of phase rotation indications in a given time period; and a decoder for comparing the count of said counter with a reference count for controlling said limiting level.

10. Apparatus as in claim 1 wherein said phase detector comprises:

means for sampling said component of said further signal at instants determined by said oscillatory signal;

means for sorting and summing said samples to provide first and second quadrature related components;

means for converting said quadrature related components to polar form having a magnitude component and an angular component; and means for selecting said angular component as said phase error signal.

11. Apparatus as in claim 1 wherein said limiter includes:

a first logic circuit for limiting said phase error signal to a first range of angles of nominally plus or minus a few units of degrees; and a second logic circuit for limiting said phase error signal to second a range of plus or minus a few tens of degrees.

12. Apparatus as in claim 11 wherein:

said first range of phase angles is nominally plus or minus three or four degrees; and said second range of phase angles is near plus or minus sixty degrees.

13. Apparatus as in claim 1 wherein said limiter includes:

a first logic circuit for limiting said phase error signal to a first range of angles of nominally plus or minus a few units of degrees; and a second logic circuit for limiting said phase error signal to second a range of plus or minus a few tens of degrees; and wherein said circuit means comprises a rotation detector for detecting rotation or non-rotation of said phase error signal in a phase plane in which zero degrees corresponds to a locked condition of said loop; and said phase error signal rotation detector excludes angles near zero and one hundred eighty degrees in processing said phase error signal to determine said rotation or non-rotation of said phase error signal.

14. Phase locked loop apparatus, comprising:

means for measuring a phase angle of a burst component of a video input signal relative to a phase reference signal supplied thereto by an oscillator to provide a phase error signal having an angular component and a magnitude component;

means for limiting said angular component of said phase angle error signal to a given range of angles and for applying the resultant limited signal to said oscillator via a loop filter to form a phase locked loop;

a detector responsive to said angular component of said phase angle error signal for providing a lock indication signal; and limiter control means for varying said given range of angles of said limiter as a function of said lock indication signal.

15. Apparatus as recited in claim 14 wherein said limiter control means comprises:

circuit means for detecting rotation of said angular component of said phase angle error signal.

16. Apparatus as recited in claim 14 wherein said limiter control means comprises:

circuit means for detecting rotation of said angular component of said phase angle error signal by comparison of current and previous phase angles, excluding at least one predetermined range of phase angles.

17. A phase locked loop for generating an oscillatory signal phase locked to a component of a further signal, comprising:

a variable oscillator for generating said oscillatory signal;

a source of said further signal;

means for sampling said further signal at instants determined by said oscillatory signal to provide in-phase and quadrature samples of said further signal;

means for converting said in-phase and quadrature samples to polar coordinates to provide a phase error vector having a magnitude component and an angular component;

a limiter for limiting said angular component of said phase error vector to a given range of angles to provide a limited angular component for phase locking said oscillatory signal with said component of said further signal; and control means for varying said range of angles of said limiter.

18. Apparatus as recited in claim 17 wherein said control means comprises lock detection means responsive to said angular component of said phase error vector and coupled to said limiter to selecting a relatively wide limiting range for said limited angular component when said loop is un-locked and for selecting a relatively narrow limiting range for said limited angular component when said loop is locked.

19. Apparatus as recited in claim 17 wherein said control means comprises a phase rotation detector responsive to said angular component of said phase error vector for providing a lock indication of a first level to a control input of said limiter if said vector is rotating and of a second level otherwise.

20. Apparatus as recited in claim 17 wherein:

said control means comprises a phase rotation detector responsive to said angular component of said phase error vector for providing a lock indication of a first level to a control input of said limiter if said vector is rotating and of a second level otherwise;

said limiter being responsive to said first level of said lock indication signal for limiting said limited angular component of said phase error vector to a first relatively narrow range of angles; and said limiter being responsive to said second level of said lock indication signal for limiting said limited angular component of said phase error signal to a second relatively wide range of angles.

* * * * *